US012811102B2

(12) United States Patent
Kim et al.

(10) Patent No.: US 12,811,102 B2
(45) Date of Patent: Nov. 24, 2026

(54) PLASMA ETCHING DEVICES AND METHODS FOR FABRICATING SEMICONDUCTOR DEVICES USING THE SAME

(71) Applicant: Samsung Electronics Co., Ltd., Suwon-si (KR)

(72) Inventors: Hyun Bae Kim, Suwon-si (KR); Hyeongmo Kang, Suwon-si (KR); Kyung-Sun Kim, Suwon-si (KR); Nam Kyun Kim, Suwon-si (KR); Donghyeon Na, Suwon-si (KR); Sang Ki Nam, Suwon-si (KR); Seongsik Nam, Suwon-si (KR); Jonghan Wang, Suwon-si (KR); Hyunjae Lee, Suwon-si (KR); Minyoung Hur, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 201 days.

(21) Appl. No.: 18/784,041

(22) Filed: Jul. 25, 2024

(65) Prior Publication Data

US 2025/0266242 A1 Aug. 21, 2025

(30) Foreign Application Priority Data

Feb. 20, 2024 (KR) ........................ 10-2024-0024459

(51) Int. Cl.
*H01J 37/32* (2006.01)

(52) U.S. Cl.
CPC ..... *H01J 37/32183* (2013.01); *H01J 37/3211* (2013.01); *H01J 37/32146* (2013.01); *H01J 37/32155* (2013.01); *H01J 37/32449* (2013.01); *H01J 2237/3346* (2013.01)

(58) Field of Classification Search
CPC ............. H01J 37/32183; H01J 37/3211; H01J 37/32146; H01J 37/32155; H01J 37/32449; H01J 37/321; H01J 37/32165; H01J 37/32174; H01J 37/32715; H01J 2237/3346; H01J 2237/334; H10P 76/204; H10P 72/0421
USPC ...................... 156/345.48; 118/723 I, 723 IR
See application file for complete search history.

(56) References Cited

U.S. PATENT DOCUMENTS

| | | | |
|---|---|---|---|
| 7,708,859 | B2 | 5/2010 | Huang et al. |
| 8,343,876 | B2 | 1/2013 | Sadjadi et al. |
| 8,368,308 | B2 | 2/2013 | Banna et al. |
| 8,551,289 | B2 | 10/2013 | Nishimura et al. |

(Continued)

FOREIGN PATENT DOCUMENTS

| | | | |
|---|---|---|---|
| JP | 2012248578 | A | 12/2012 |
| KR | 20060114151 | A | 11/2006 |
| KR | 100751535 | B1 | 8/2007 |

*Primary Examiner* — Rodney G Mcdonald
(74) *Attorney, Agent, or Firm* — Wolf, Greenfield & Sacks, P.C.

(57) ABSTRACT

A plasma etching device includes: a dual radio frequency (RF) generator configured to generate a second power signal having a second frequency and a first power signal having a first frequency, which is at least 12 MHz higher than the second frequency, a match circuit configured to perform impedance matching based on an impedance of the dual RF generator, a chamber including a wafer support, and an antenna inductively couplable to an interior of the chamber by an inner coil configured to receive the first power signal, and an outer coil configured to receive the second power signal.

20 Claims, 9 Drawing Sheets

(56) References Cited

U.S. PATENT DOCUMENTS

| | | | |
|---|---|---|---|
| 10,079,133 | B2 | 9/2018 | Murayama et al. |
| 10,573,493 | B2 | 2/2020 | Todorow et al. |
| 2010/0025384 | A1 | 2/2010 | Todorow et al. |
| 2011/0097901 | A1 | 4/2011 | Banna et al. |

PLASMA ETCHING DEVICES AND METHODS FOR FABRICATING SEMICONDUCTOR DEVICES USING THE SAME

REFERENCE TO PRIORITY APPLICATION

This application claims priority under 35 U.S.C. § 119 to Korean Patent Application No. 10-2024-0024459, filed Feb. 20, 2024, the disclosure of which is hereby incorporated herein by reference.

BACKGROUND

Embodiments of the present disclosure described herein relate to plasma etching devices and, more particularly, to an inductively coupled plasma (ICP) etching devices and methods of fabricating semiconductor devices using the same.

An inductively coupled plasma (ICP) etching device is used to form a fine pattern or a fine structure of a semiconductor device in the fabricating process of a semiconductor or an electronic device. The ICP etching device performs an etching process by generating electrically activated plasma. An ICP etching process is generally used with various active gases. An active gas is used to generate plasma and induce a chemical reaction on a semiconductor surface to accurately control the fine pattern. To implement high-resolution and high-accuracy etching, it is typically necessary to adjust the frequency of the power applied to various coils used in the ICP etching process.

SUMMARY

Embodiments of the present disclosure provide ICP etching devices that are configured to generate plasmas having higher electron energies.

Embodiments of the present disclosure provide methods for fabricating semiconductor devices by performing an etching process using plasmas having higher electron energies.

A plasma etching device may include a dual radio frequency (RF) generator that generates a first power signal and a second power signal, a match circuit that performs impedance matching based on an impedance of the dual radio frequency generator, an inductively coupled antenna including an inner coil to receive the first power signal and an outer coil to receive the second power signal, and a chamber including a wafer support. Advantageously, a first frequency of the first power signal is at least 12 MHz higher than a second frequency of the second power signal.

A method of etching using an inductively coupled plasma etching device having an inner coil and an outer coil may include placing a wafer on a wafer support within a chamber, supplying gas into the chamber, generating plasma by applying a first power signal to the inner coil, and applying a second power signal to the outer coil, and applying a bias signal to the wafer support such that the wafer is etched. A first frequency of the first power signal is at least 12 MHz higher than a second frequency of the second power signal.

A method for fabricating a semiconductor device may include forming a photoresist film on a wafer, exposing a part of a top surface of the wafer by removing a part of the photoresist film using a photomask, performing an etching process using a plasma etching device including an inner coil and an outer coil, and removing the photoresist film remaining on the wafer. The performing of the etching process may include generating a plasma by applying a first power signal having a first frequency to the inner coil, and applying a second power signal having a second frequency to the outer coil. The first frequency of the first power signal is at least 12 MHz higher than the second frequency of the second power signal.

A plasma etching device according to a further embodiment of the invention may include: a dual radio frequency (RF) generator configured to generate a second power signal having a second frequency and a first power signal having a first frequency, which is at least 12 MHz higher than the second frequency, a chamber having a wafer support therein, and an antenna mounted external to the chamber. The antenna may include an outer coil responsive to the second power signal, and the outer coil may be configured to generate a second magnetic flux that is inductively couplable to a gas within the chamber, in response to the second power signal. The antenna may also include an inner coil at least partially nested within the outer coil, and the inner coil may be configured to generate a first magnetic flux that is inductively couplable to the gas within the chamber, in response to the first power signal.

BRIEF DESCRIPTION OF THE FIGURES

The above and other objects and features of the present disclosure will become apparent by describing in detail embodiments thereof with reference to the accompanying drawings.

DETAILED DESCRIPTION OF EMBODIMENTS

Hereinafter, the embodiments of the present disclosure will be clearly and in detail such that those skilled in the art may easily reproduce the present disclosure.

Figure 1:
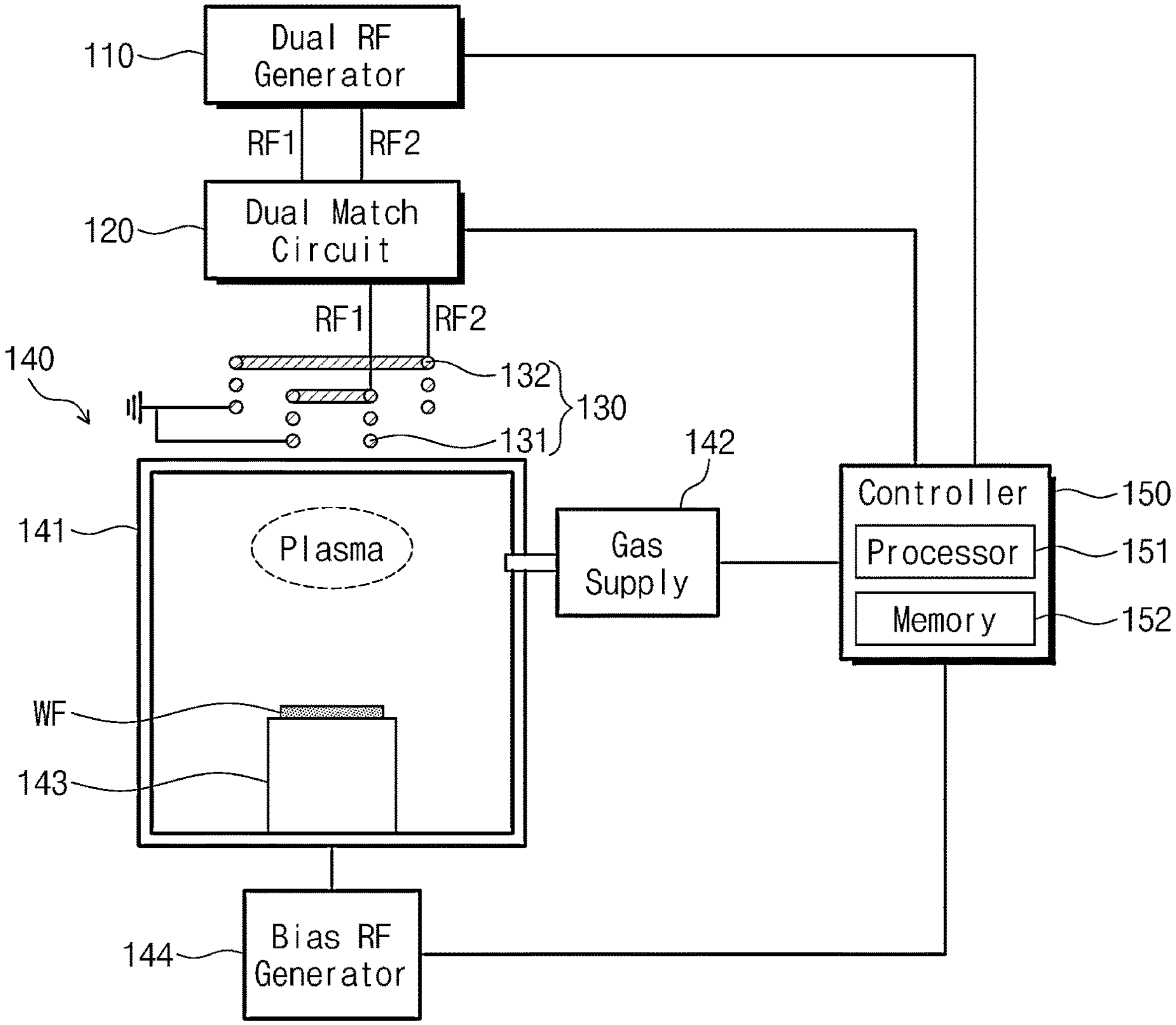
FIG. 1 is a view illustrating a plasma etching device according to an embodiment of the present disclosure.
Figure 2:
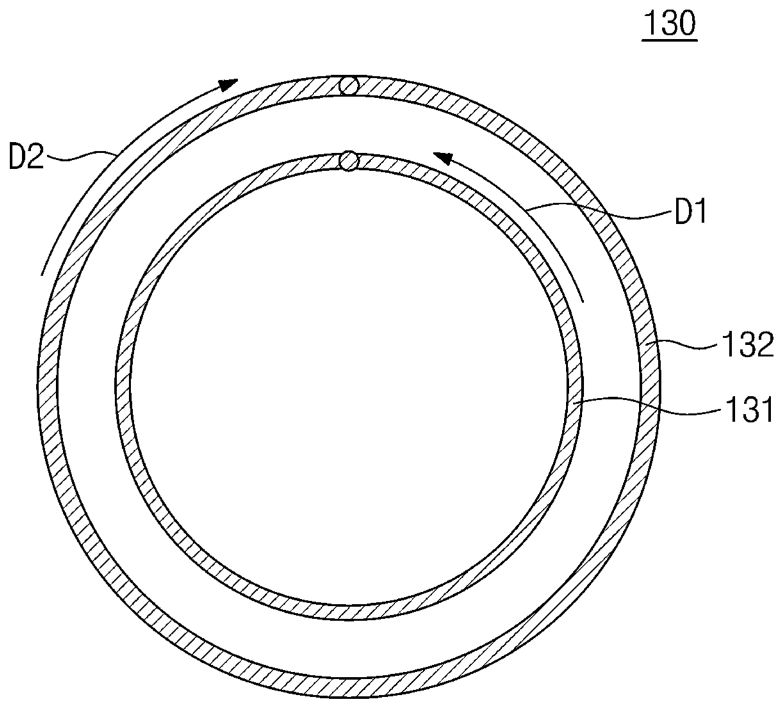
FIG. 2 is a view illustrating an inductively coupled antenna of FIG. 1.

FIG. 1 is a view illustrating a plasma etching device 100 according to an embodiment of the present disclosure. FIG. 2 is a view illustrating an inductively coupled antenna of FIG. 1. According to an embodiment, a plasma etching device 100 may be an inductively coupled plasma (ICP) etching device used for etching a wafer WF. The configuration of the inductively coupled plasma etching device may be appropriately modified and/or utilized according to the suggestion provided in the present specification.

Alternatively, the ICP etching device disclosed in FIG. 1 may be modified as part of another ICP etching device. For example, the ICP etching device may be modified from the ICP etching devices disclosed in: U.S. Patent Publication No. 2010/0025384 to Todorow et al., entitled "FIELD ENHANCED INDUCTIVELY COUPLED PLASMA (FE-ICP) REACTOR," U.S. Pat. No. 10,573,493 to Todorow et al., entitled "INDUCTIVELY COUPLED PLASMA APPARATUS," and U.S. Patent Publication No. 2011/0097901 to Banna et al., entitled "DUAL MODE INDUCTIVELY COUPLED PLASMA WITH ADJUSTABLE PHASE COIL ASSEMBLY." For example, the plasma etching device 100 according to the present disclosure may be applied to many forms of inductively coupled plasma etching devices using RF power and/or RF bias sources. Such a plasma etching device may include a plasma annealing etching device, a plasma-enhanced chemical vapor deposition etching device, a physical vapor deposition etching device, or a plasma cleaning etching device.

Referring to FIG. 1, according to an embodiment, the plasma etching device 100 may include a dual radio frequency (RF) generator 110, a dual match circuit 120, an inductively coupled antenna 130, a plasma generator 140, and a controller 150. As described more fully hereinbelow, the dual RF generator 110 may be configured to generate a first power signal RF1 and a second power signal RF2. The first power signal RF1 may be an RF power signal having a first frequency, and the second power signal RF2 may be an RF power signal having a second frequency. According to an embodiment, the first frequency may be higher than the second frequency. For example, the first frequency may be at least 12 MHz higher than the second frequency. In particular, the first frequency may be about 27.12 MHz, and the second frequency may be about 2.0 MHz.

The dual match circuit 120 may be configured to perform impedance matching based on an impedance at each of an input stage and an output stage. For example, the input stage of the dual match circuit 120 may be connected to an output stage of the dual RF generator 110, and the output stage of the dual match circuit 120 may be connected to the inductively coupled antenna 130. The detailed configurations and operations of the dual RF generator 110 and the dual match circuit 120 will be described later with reference to FIGS. 3 to 5.

The inductively coupled antenna 130 may include an inner coil 131 and an outer coil 132. The first power signal RF1 may be applied to the inner coil 131, and the second power signal RF2 may be applied to the outer coil 132. The inner coil 131 and the outer coil 132 may be configured to generate inductive coupling energy based on the first power signal RF1 and the second power signal RF2, respectively. In particular, the inner coil 131 may transmit RF energy (for example, induced electromotive force) into a chamber 141, based on the first power signal RF1, to thereby generate a plasma by heating gas in the chamber 141. The plasma may be generated by supplying energy to gas molecules through the inner coil 131. For example, electrons may be accelerated by a magnetic field which is generated inside the chamber 141 and collide with the gas molecules, thereby generating radicals and ions.

In addition, the outer coil 132 may transmit RF energy into the chamber 141 based on the second power signal RF2. For example, the outer coil 132 may be to stabilize or amplify the plasma which is generated in the chamber 141. The shape and the size of the plasma inside the chamber 141 may be controlled through the outer coil 132.

Referring to FIG. 2, the inner coil 131 may have a radius smaller than that of the outer coil 132. The inner coil 131 and the outer coil 132 may have the same central point (i.e., the coils 131, 132 may be coaxial), and the inner coil 131 may be placed inside the outer coil 132. Each of the inner coil 131 and the outer coil 132 may be designed in a circular shape, but the present disclosure is not limited thereto. For example, the inner coil 131 and the outer coil 132 may have a polygonal shape such as a triangular shape, or a square rectangular shape, or an elliptical shape.

A current flowing through the inner coil 131 may have a direction different from a direction of a current flowing through the outer coil 132. For example, when the current flows through the inner coil 131 in a counterclockwise direction D1, the current may flow through the outer coil 132 in a clockwise direction D2. In other words, a direction of the induced electromotive force generated by the inner coil 131 may be opposite to a direction of the induced electromotive force generated by the outer coil 132.

According to an embodiment, when the inner coil 131 and the outer coil 132 are wound in the same direction, the direction of the current flowing through each of the inner coil 131 and the outer coil 132 may be controlled by the phase of a signal applied to each of the inner coil 131 and the outer coil 132. For example, when the phases of the first power signal RF1 applied to the inner coil 131 and the second power signal RF2 applied to the outer coil 132 are different from each other (for example, when the phases are 180 degrees different from each other), the direction of the current flowing through the inner coil 131 and the direction of the current flowing through the outer coil 132 may be opposite to each other.

According to another embodiment, the direction of the current flowing through each of the inner coil 131 and the outer coil 132 may be controlled by the direction in which each of the inner coil 131 and the outer coil 132 is wound. For example, the inner coil 131 may be wound in the first direction (counterclockwise direction) D1, and the outer coil 132 may be wound in the second direction (clockwise direction) D2 opposite to the first direction D1. Accordingly, when the first power signal RF1 applied to the inner coil 131 is in phase with the second power signal RF2 applied to the outer coil 132, the direction of the current flowing through the inner coil 131 may be opposite to the direction of the current flowing through the outer coil 132.

However, depending on cases of controlling the amount or distribution of plasma generated inside the chamber 141, the directions of the currents flowing through the inner coil 131 and the outer coil 132 may be controlled to be the same, or may be controlled to be opposite to each other for a specific period of time and to be the same only for a specific period of time.

Referring again to FIG. 1, the plasma generator 140 may include the chamber 141, a gas supply 142, a wafer support 143, and a bias RF generator 144. The chamber 141 may be the cylindrical chamber 141, but the present disclosure is not limited thereto. The chamber 141 may be disposed under the inductively coupled antenna 130. The gas supply 142 may supply gas to generate plasma into the chamber 141. The gas may be argon gas, oxygen gas, nitrogen gas, chloride gas, or a mixture gas of at least two or more thereof. The wafer support 143 may be placed on a bottom surface inside the chamber 141. The wafer support 143 serving as a cathode electrode may be configured to transmit a bias signal to the wafer WF. The bias RF generator 144 may apply the bias signal to the wafer WF through the wafer support 143. The bias signal may be an RF power signal applied to the cathode for the wafer. The plasma generated by the electric field inside the chamber 141 includes radicals and ions. The radicals are diffused into the wafer WF, and the bias signal is applied to the wafer support 143 such that ions may be accelerated onto the wafer. Accordingly, the radicals and the accelerated ions collide with part, which is exposed by a photomask pattern, of a top surface of the wafer WF, such that the part is etched.

The controller 150 may be configured to perform an etching process by controlling the dual RF generator 110, the dual match circuit 120, the gas supply 142, and the bias RF generator 144. When performing the etching process through various interfaces such as analog, digital, wired, wireless, optical or optical fiber interfaces, the controller 150 may be connected to the dual RF generator 110, the dual match circuit 120, the gas supply 142, and the bias RF generator 144, respectively.

The controller 150 may include a processor 151 and a memory 152. To facilitate the control over the chamber 141 as described below, the processor 151 may be one of any form of general-purpose computer processors which may be used under an industrial environment, to control various chambers 141 and processors in a lower level. For example, the processor 151 may be a central processing unit (CPU). The memory 152 may be at least one out-of-the-box memory device, such as a random access memory, a read only memory, a floppy disk, a hard disk, or any other form of digital storage device provided locally or remotely.

The memory 152 may be a computer-readable medium configured to store various instructions for performing an etching process. For example, process instructions, such as etching or other process instructions, are stored in the memory 152 as a software routine generally known as a recipe. The software routines may be stored and/or executed remotely from another processor provided outside the processor 151 or the controller 150. When the software routine is executed by the processor 151, a general purpose computer may be converted to a specific purpose computer having a specific purpose of generating and controlling plasma during the etching process. As described above, the controller 150 may be implemented in the form of software, which is executed in a computer system, hardware implemented in the form of a specific application integrated circuit or another type of hardware, or the combination of software and hardware. The controller 150 may further include a support circuit such as a cache, a power supply, a clock circuit, an input/output circuit, and a relevant subsystem.

Figure 3:
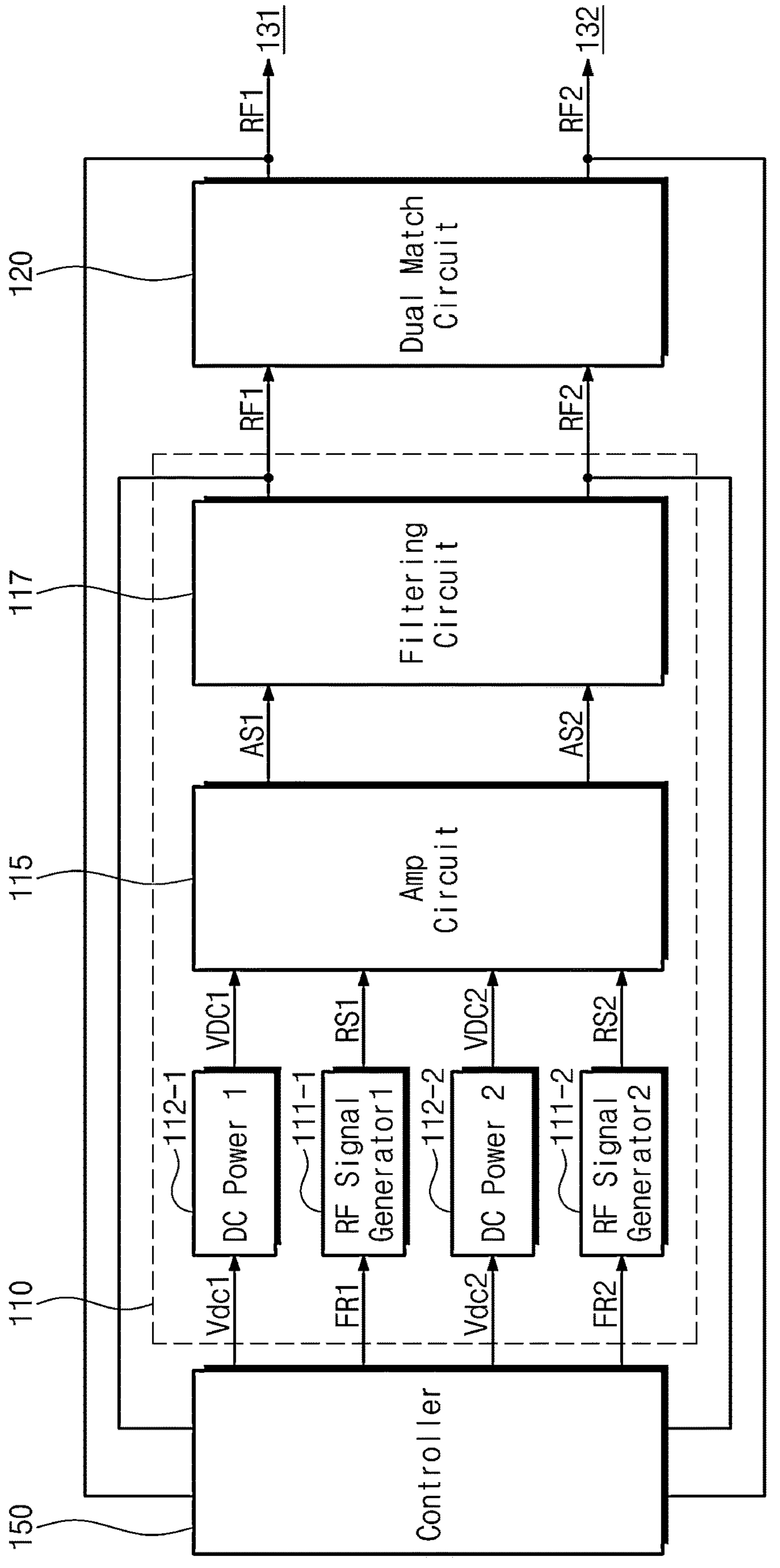
FIG. 3 is a block diagram illustrating a dual RF generator and a dual match circuit of FIG. 1.

FIG. 3 is a block diagram illustrating the dual RF generator and the dual match circuit of FIG. 1. First, referring to FIG. 3, the dual RF generator 110 may include a first RF signal generator 111-1, a second RF signal generator 111-2, a first DC power supply 112-1, a second DC power supply 112-2, an amplifying circuit 115, and a filtering circuit 117.

The controller 150 may be configured to output first frequency information FR1 for setting the first frequency and second frequency information FR2 for setting the second frequency. The controller 150 may set the first frequency information FR1 such that a frequency varies within a specific error range (e.g., an error range from −10% to +10%) based on the first frequency, and set the second frequency information FR2 such that a frequency varies within a specific error range (e.g., an error range of −10% to +10%) based on the second frequency value. For example, if the first frequency is 27 MHz, and the first frequency information FR1 may be fluctuated in a range from 24.3 MHz to 30.7 MHz. And, if the second frequency is 2 MHz, and the second frequency information FR2 may be fluctuated in a range from 1.8 MHz to 2.2 MHz. In addition, the controller 150 may be configured to output first DC voltage information Vdc1 for outputting a first DC voltage VDC1 and second DC voltage information Vdc2 for outputting a second DC voltage VDC2.

The first RF signal generator 111-1 may be configured to receive the first frequency information FR1 from the controller 150. The first RF signal generator 111-1 may generate a first RF signal RS1 having the first frequency based on the first frequency information FR1. For example, the first RF signal RS1 may be in the form of a sinusoidal wave, but the present disclosure is not limited thereto. The first RF signal RS1 may be a signal having the same frequency as the first power signal RF1 and having a less intensity (e.g., a smaller amplitude).

The second RF signal generator 111-2 may be configured to receive the second frequency information FR2 from the controller 150. The second RF signal generator 111-2 may generate a second RF signal RS2 having the second frequency based on the second frequency information FR2. For example, the second RF signal RS2 may be in the form of a sinusoidal wave, but the present disclosure is not limited thereto. The second RF signal RS2 may be a signal having the same frequency as that of the second power signal RF2 and having a less intensity (e.g., a smaller amplitude).

The first DC power supply 112-1 generates the first DC voltage VDC1 and supplies the generated first DC voltage VDC1 to the amplifying circuit 115. The second DC power supply 112-2 generates the second DC voltage VDC2 and supplies the generated second DC voltage VDC2 to the amplifying circuit 115. The amplifying circuit 115 may amplify the first RF signal RS1 to generate a first amplified signal AS1 and amplify the second RF signal RS2 to generate a second amplified signal AS2. The first amplified signal AS1 may have an amplitude larger than that of the first RF signal RS1, and the second amplified signal AS2 may have an amplitude larger than that of the second RF signal RS2. For example, the amplifying circuit 115 may include a D-class amplifier. The first amplified signal AS1 may include frequency components having an integer multiple of the first frequency, and the second amplified signal AS2 may include frequency components having an integer multiple of the second frequency.

The filtering circuit 117 may generate the first power signal RF1 by filtering the first amplified signal AS1 and the second power signal RF2 by filtering the second amplified signal AS2. According to an embodiment, the filtering circuit 117 may output only a low band component and remove a high band component, among the frequency components of the first amplified signal AS1. For example, the low band may be a frequency band including the first frequency, and the high band may be a frequency band including a frequency of at least two times the first frequency.

The filtering circuit 117 may output only the low band component and remove a high band component, among the frequency components of the second amplified signal AS2. For example, the low band may be a frequency band including the second frequency, and the high band may be a frequency band including a frequency of at least two times the second frequency.

The filtering circuit 117 may further include a current sensor and a voltage sensor. The current sensor may measure currents of the first power signal RF1 and the second power signal RF2 at the output stage of the filtering circuit 117, and the voltage sensor may measure voltages of the first power signal RF1 and the second power signal RF2 at the output stage of the filtering circuit 117. The currents and the voltages measured by the current sensor and the voltage sensor may be provided to the controller 150. The dual match circuit 120 may further include a current sensor and a voltage sensor. The current sensor may measure currents of the first power signal RF1 and the second power signal RF2 at the output stage of the dual match circuit 120, and the voltage sensor may measure voltages of the first power signal RF1 and the second power signal RF2 at the output stage of the dual match circuit 120. The currents and the voltages measured by the current sensor and the voltage sensor may be provided to the controller 150. The controller 150 may be configured to control the first frequency information FR1, the second frequency information FR2, the first DC voltage information Vdc1, and the second DC voltage information Vdc2 based on the currents and voltages which are measured. The dual match circuit 120 may be configured to perform impedance matching between the output stage of the dual RF generator 110 and the input stage of the inductively coupled antenna 130.

Figure 4:
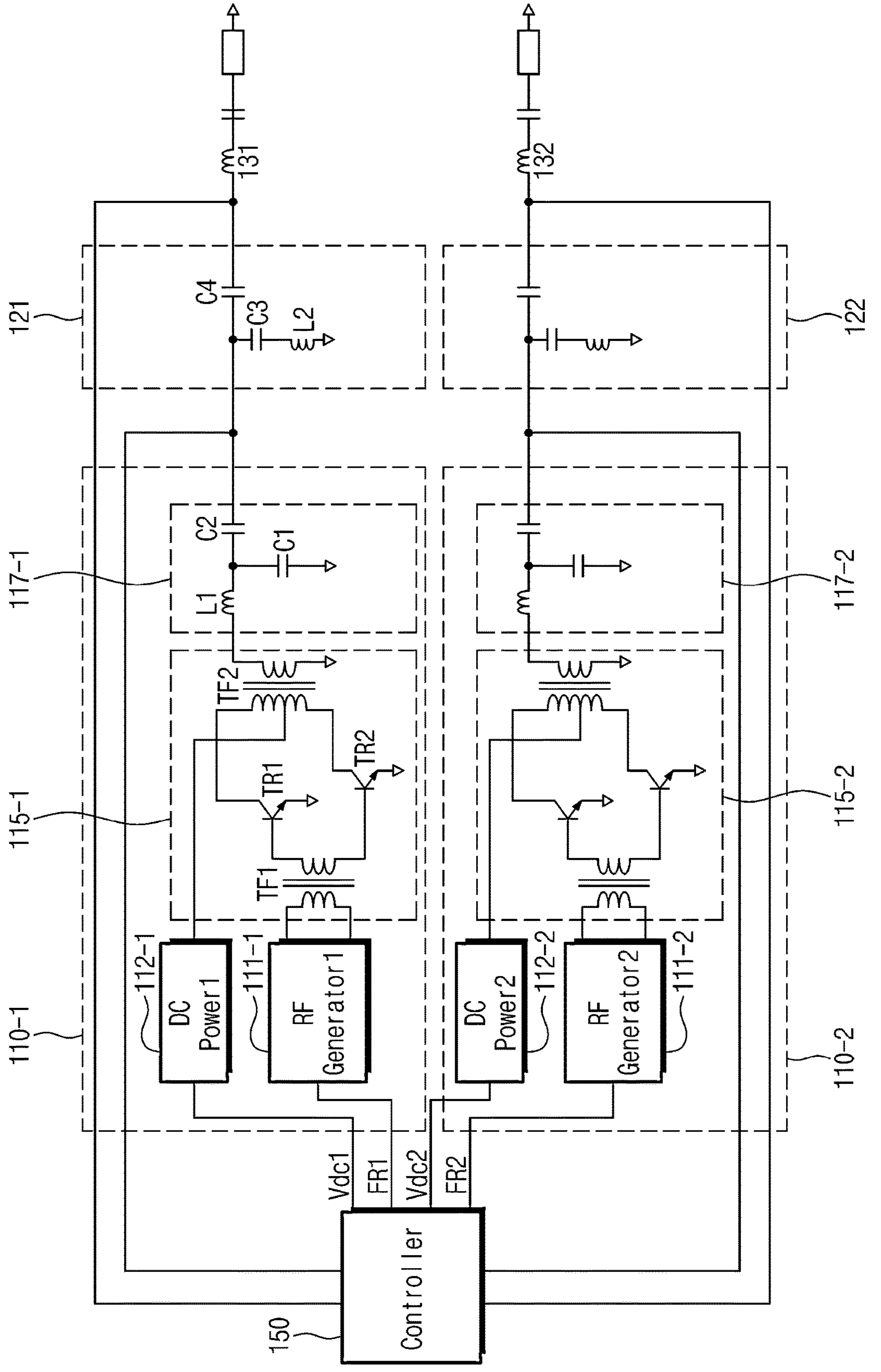
FIG. 4 is a view illustrating one example of the dual RF generator and the match circuit of FIG. 3.
Figure 5:
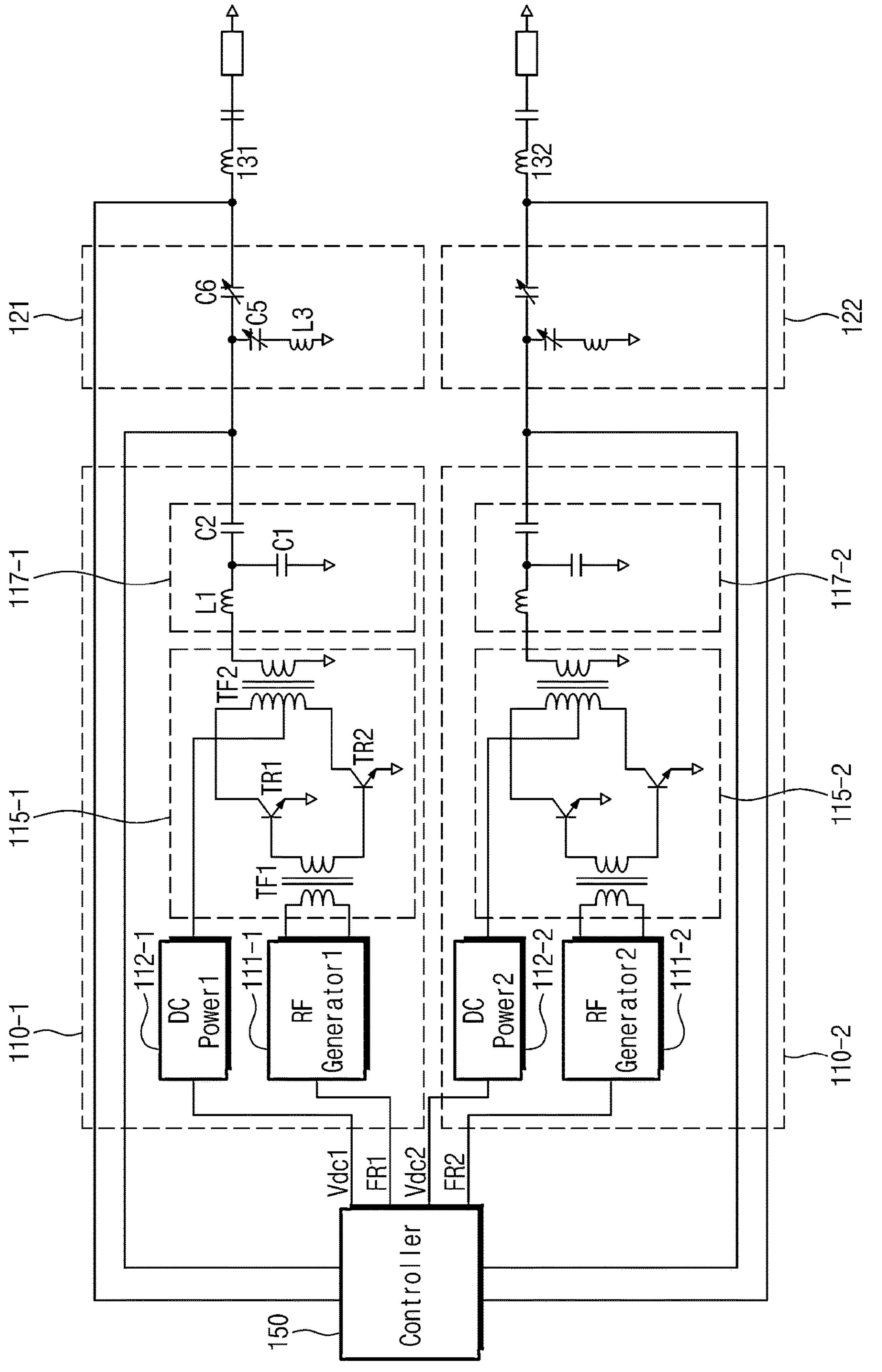
FIG. 5 is a view illustrating another example of the dual RF generator and the dual match circuit of FIG. 3.

FIG. 4 is a view illustrating one example of the dual RF generator and the dual match circuit of FIG. 3. FIG. 5 is a view illustrating another example of the dual RF generator and the dual match circuit of FIG. 3. Hereinafter, the dual RF generator 110 and the dual match circuit 120 will be described in detail with reference to FIGS. 4 and 5.

The dual RF generator 110 may include a first power signal output circuit 110-1 configured to output the first power signal RF1 and a second power signal output circuit 110-2 configured to output the second power signal RF2. According to an embodiment, the first power signal output circuit 110-1 may include the first RF signal generator 111-1, the first DC power supply 112-1, a first amplifier 115-1, and a first filter 117-1, and the second power signal output circuit 110-2 may include the second RF signal generator 111-2, the second DC power supply 112-2, a second amplifier 115-2, and a second filter 117-2. The amplifying circuit 115 of the dual RF generator 110 may include the first amplifier 115-1 and the second amplifier 115-2. The filtering circuit 117 of the dual RF generator 110 may include the first filter 117-1 and the second filter 117-2.

The configuration of the second power signal output circuit 110-2 may be designed to be substantially the same as that of the first power signal output circuit 110-1. Hereinafter, the first power signal output circuit 110-1 will be representatively described in detail.

The first amplifier 115-1 may be configured to amplify the first RF signal RS1 generated from the first RF signal generator 111-1. According to an embodiment, the first amplifier 115-1 may include a first transformer TF1, a first transistor TR1, a second transistor TR2, and a second transformer TF2. For example, the first amplifier 115-1 may be a D-class amplifier configured to generate a square wave.

The first transformer TF1 may be configured to receive the first RF signal RS1. For example, the first transformer TF1 may boost the received voltage of the first RF signal RS1. Opposite terminals of the first transformer TF1 may be connected to gate terminals of the first transistor TR1 and the second transistor TR2, respectively. Source terminals of the first transistor TR1 and the second transistor TR2 may be connected to the ground, and opposite terminals of the second transformer TF2 may be connected to drain terminals of the first transistor TR1 and the second transistor TR2. The second transformer TF2 may receive a first DC voltage from the first DC power supply 112-1, and the controller 150 may be configured to output a first DC voltage information Vdc1 to the first DC power supply 112-1 to control an amplifier.

The first filter 117-1 may be configured to filter the first amplified signal AS1 generated from the first amplifier 115-1. The first filter 117-1 may include a first inductor L1, a first capacitor C1, and a second capacitor C2. The first inductor L1 and the first capacitor C1 may be connected to each other in series. For example, the output stage of the first amplifier 115-1 may be connected to one terminal of the first inductor L1, and the ground may be connected to one terminal of the first capacitor C1. The second capacitor C2 may be connected to a node between the first inductor L1 and the first capacitor C1.

A reactance value of each of the first inductor L1, the first capacitor C1, and the second capacitor C2 may be set based on an output impedance of the first RF signal generator 111-1, the amplifying circuit 115, and the filtering circuit 117. According to an embodiment, the output impedance of the first RF signal generator 111-1, the amplifying circuit 115, and the filtering circuit 117 may be set to 50 ohms, and the reactance value of each of the first inductor L1, the first capacitor C1, and the second capacitor C2 may be designed to be optimized to 50 ohms. According to another embodiment, the output impedance of the first RF signal generator 111-1, the amplifying circuit 115, and the filtering circuit 117 may be set to be less than 2 ohms, and the reactance value of each of the first inductor L1, the first capacitor C1, and the second capacitor C2 may be designed to be optimized to a value less than 2 ohms.

Although FIG. 4 illustrates that the first power signal RF1 is generated by using the first amplifier 115-1 which is a D-class amplifier and the first filter 117-1 which is a low-band filter according to an embodiment, it should be understood which the filtering circuit 117 may be appropriately changed, modified or omitted depending on the configuration of the first RF signal generator 111-1 or the amplifier.

The dual match circuit 120 may include a first match circuit 121 and a second match circuit 122. The first match circuit 121 may be connected between the first power signal output circuit 110-1 and the inner coil 131, and the second match circuit 122 may be connected between the second power signal output circuit 110-2 and the outer coil 132. The first match circuit 121 is configured to perform impedance matching between the first power signal output circuit 110-1, and the inner coil 131 and the capacitor, and the second match circuit 122 may be configured to perform impedance matching between the second power signal output circuit 110-2, and the outer coil 132 and the capacitor.

The first match circuit 121 and the second match circuit 122 may be designed to have substantially the same configuration, and hereinafter, the first match circuit 121 will be described in detail. The first match circuit 121 may include a second inductor L2, a third capacitor C3, and a fourth capacitor C4. The third capacitor C3 and the second inductor L2 may be connected to each other in series. For example, the output stage of the first filter 117-1 may be connected to one terminal of the third capacitor C3, which is an input stage of the first match circuit 121, and the ground may be connected to one terminal of the second inductor L2. One terminal of the fourth capacitor C4 may be connected to the output stage of the first filter 117-1, and a remaining terminal of the fourth capacitor C4 may be provided in the form of an output stage of the first match circuit 121.

According to an embodiment, each of the first match circuit 121 and the second match circuit 122 may include a fixed capacitor. For example, a reactance value of each of the second inductor L2, the third capacitor C3, and the fourth capacitor C4 may have a fixed value. The reactance value of each of the second inductor L2, the third capacitor C3, and the fourth capacitor C4 may be set to match the impedance at the input stage of the first match circuit 121 with the impedance at the output stage of the first match circuit 121. For example, the first match circuit 121 may be set to match the impedance of the first RF signal generator 111-1, the first amplifier 115-1, and the first filter 117-1, which are connected to the input stage of the first match circuit 121, with the impedance of the inductively coupled antenna 130 including the inner coil 131 connected to the output stage of the first match circuit 121.

When the first match circuit 121 includes the fixed capacitor, the controller 150 may be configured to control the first RF signal generator 111-1 and the second RF signal generator 111-2 to generate a signal optimized for the first match circuit 121. For example, the controller 150 may set the first frequency information FR1 and the second frequency information FR2 to have a frequency value optimized for the first match circuit 121 while adjusting the first frequency information FR1 and the second frequency information FR2 within a specific error range.

The output stage of the first match circuit 121 may be connected to the inner coil 131 of the inductively coupled antenna 130, and the output stage of the second match circuit 122 may be connected to the outer coil 132 of the inductively coupled antenna 130. In other words, the first power signal RF1 output from the first filter 117-1 may be transmitted to the inner coil 131 through the first match circuit 121, and the second power signal RF2 output from the second filter 117-2 may be transmitted to the outer coil 132 through the second match circuit 122. According to an embodiment, it should be understood that the first match circuit 121 may be an L-type match circuit, but the present disclosure is not limited thereto, and the design may be modified to a pie-type match circuit further including a capacitor and an inductor.

Referring to FIG. 5, according to an embodiment, a dual RF generator 110 may have substantially the same configuration as the dual RF generator 110 described with reference to FIG. 4. According to an embodiment of FIG. 5, a dual match circuit 120 may include a variable capacitor, which is different from that of FIG. 4. In the following description, the duplication of components the same as the components of FIG. 4 will be omitted, and components of the dual match circuit 120 different from the components of FIG. 4 will be mainly described below.

The dual match circuit 120 may include a first match circuit 121 and a second match circuit 122. The first match circuit 121 and the second match circuit 122 may be designed to have substantially the same configuration, and hereinafter, the first match circuit 121 will be representatively described in detail. The first match circuit 121 may include a variable capacitor. For example, the first match circuit 121 may include a third inductor L3, a fifth capacitor C5, and a sixth capacitor C6, and the fifth capacitor C5 and the sixth capacitor C6 may be variable capacitors. In other words, a reactance value of each of the fifth capacitor C5 and the sixth capacitor C6 may vary. When the first match circuit 121 and the second match circuit 122 each include a variable capacitor, the controller 150 may perform impedance matching by controlling the variable capacitor of the first match circuit 121 and the variable capacitor of the second match circuit 122 and by adjusting the first frequency information FR1 and the second frequency information FR2.

Figure 6:
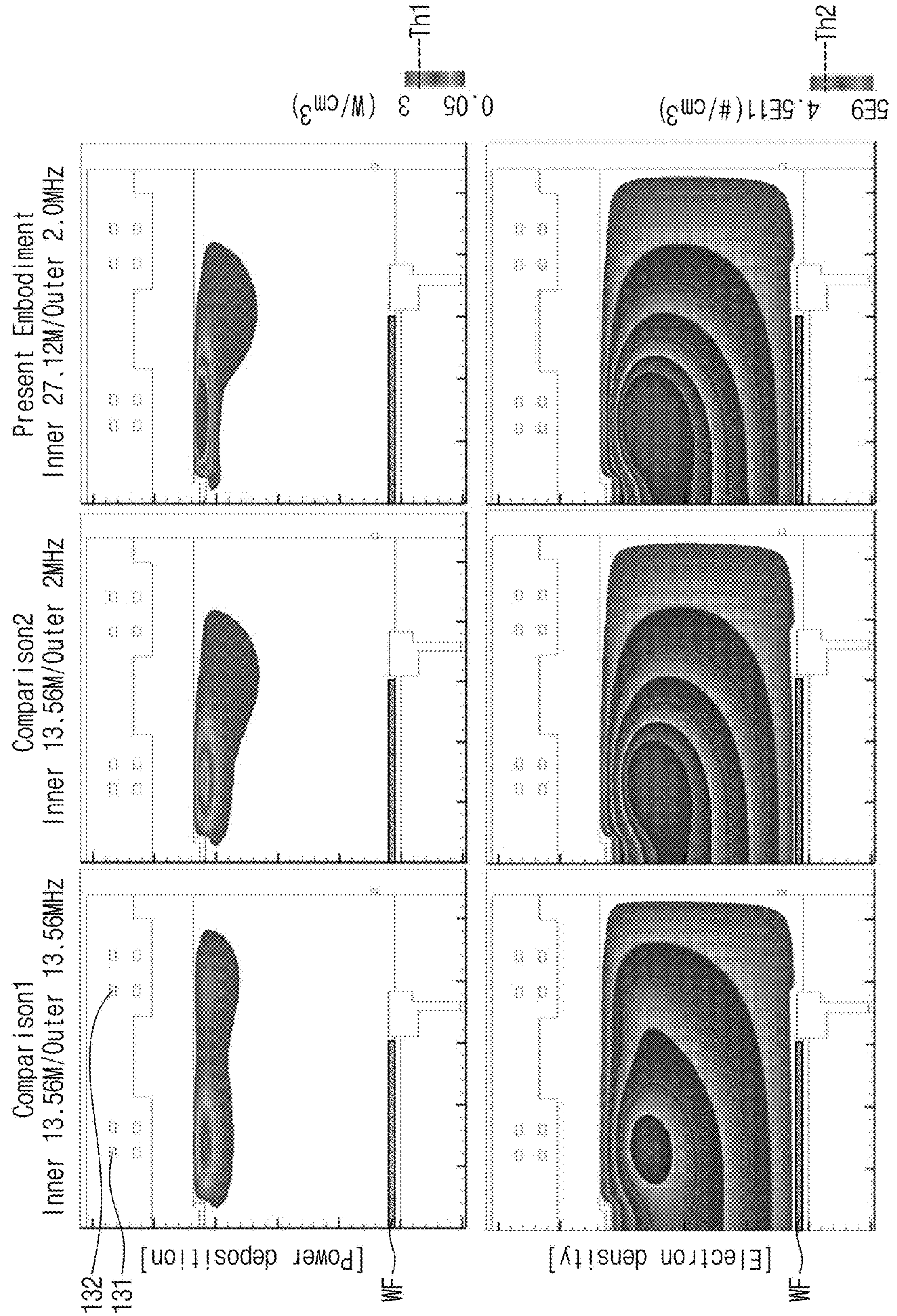
FIG. 6 illustrates graphs of a power distribution and an electron density in a first comparative example, a second comparative example, and an embodiment of the present disclosure.
Figure 7:
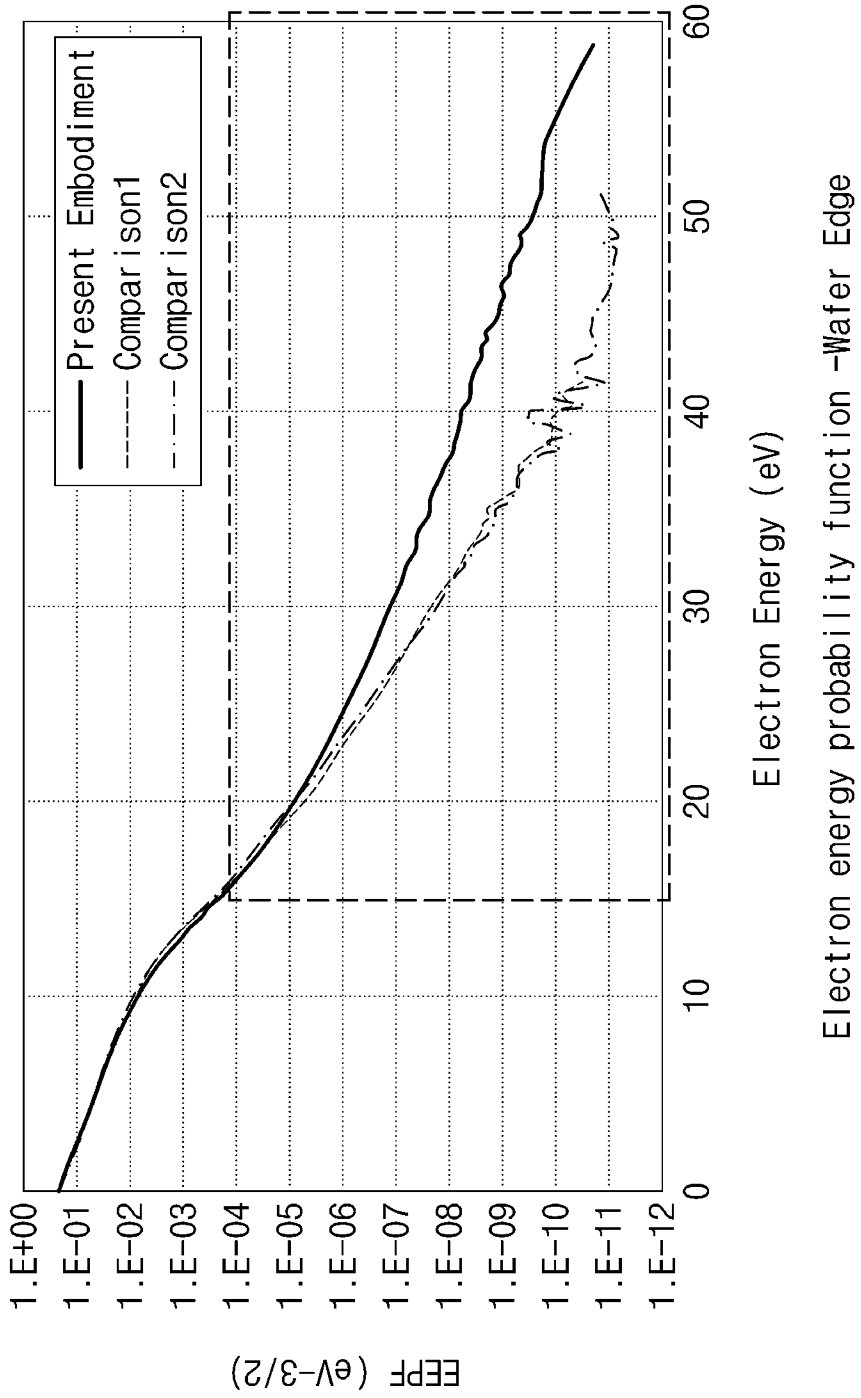
FIG. 7 is a graph of an electron energy probability function (EEPF) according to a first comparative example, a second comparative example, and an embodiment of the present disclosure.

FIGS. 6 and 7 are views to describe an improved effect of plasma etching facility according to the present disclosure. The following description will be made with reference to FIG. 1. FIG. 6 illustrates graphs of a power distribution and an electron density in a first comparative example, a second comparative example, and an embodiment of the present disclosure. The power distribution may refer to the distribution of an energy intensity transferred from the inductively coupled antenna 130 into the chamber 141, and the electron density may refer to a density of plasma generated inside the chamber 141. Each graph illustrates parts of the inner coil 131 and the outer coil 132 placed on the wafer.

According to the first comparative example, the second comparative example, and the embodiment of the present disclosure, the first frequency of the first power signal RF1 applied to the inner coil 131 and the second frequency of the second power signal RF2 applied to the outer coil 132 may be set to different frequencies.

Referring to FIG. 6, the first frequency and the second frequency are set to 13.56 MHz according to the first comparative example, the first frequency is set to 13.56 MHz and the second frequency is set to 2 MHz according to the second comparative example, and the first frequency is set to 27.12 MHz and the second frequency is set to 2 MHz according to an embodiment of the present disclosure. In other words, according to the present disclosure, the difference between the first frequency and the second frequency has a difference of 12 MHz or more. According to a further embodiment of the present disclosure, it may be recognized which a region having a value equal to or greater than a first threshold Th1 in the power distribution is formed more widely, and a region, which has an electron density of at least a second threshold Th2, of the wafer is expanded, as compared to those of the first comparative example and the second comparative example.

FIG. 7 is a graph of an electron energy probability function (EEPF) according to a first comparative example, a second comparative example, and an embodiment of the present disclosure. In FIG. 7, an X axis represents a magnitude of the electron energy, and a Y axis represents an EEPF value. The higher EEPF value may refer to that plasma having higher energy is generated in the chamber 141. When plasma having higher energy is generated, an etch rate and an aspect ratio may be improved in the etching process. Referring to FIG. 7, the first frequency and the second frequency are set to 13.56 MHz according to the first comparative example, the first frequency is set to 13.56 MHz and the second frequency is set to 2 MHz according to a second comparative example, and the first frequency is set to 27.12 MHz and the second frequency is set to 2 MHz, according to an embodiment of the present disclosure, which are similar to FIG. 6.

According to an embodiment of the present disclosure, it may be recognized that the probability of having energy of 15 eV or more is increased, as compared to those of the first comparative example and the second comparative example. In other words, according to the present disclosure, it may be recognized that the plasma generated in the chamber 141 may have higher energy (e.g., average kinetic energy) as compared to those of the first comparative example and the second comparative example.

Figure 8:
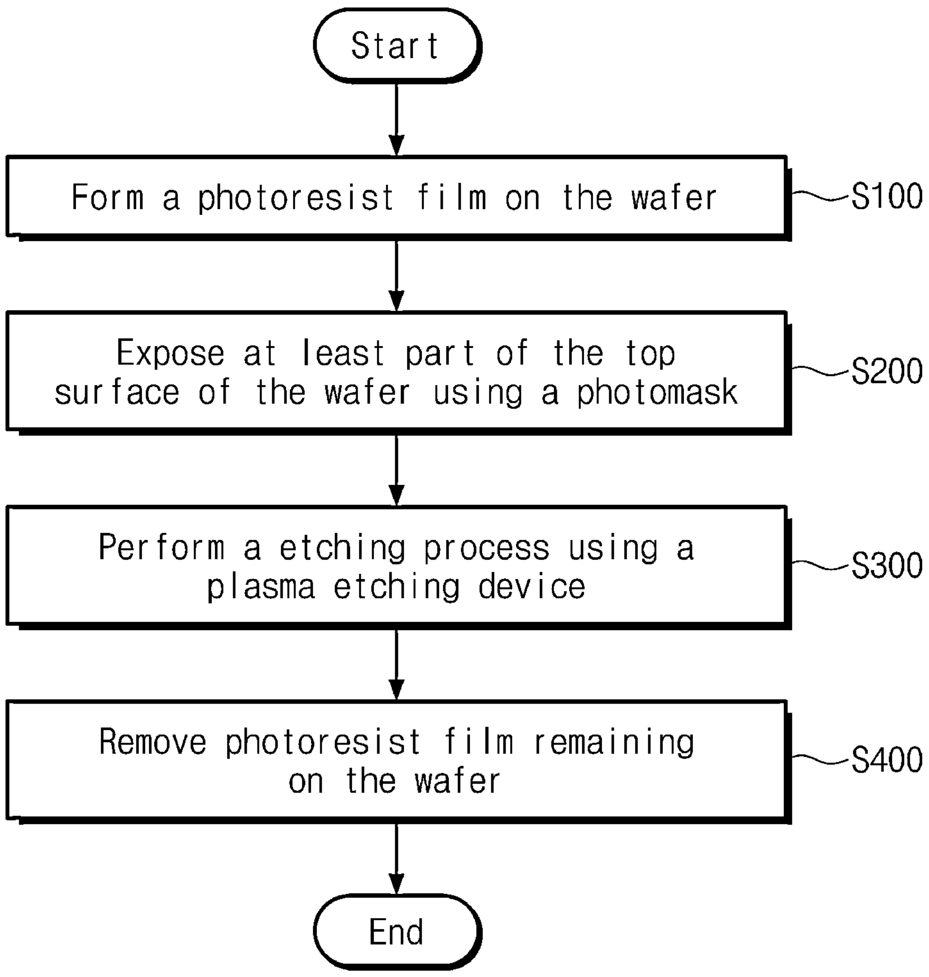
FIG. 8 is a flowchart illustrating a method for fabricating a semiconductor device according to an embodiment of the present disclosure.

FIG. 8 is a flowchart illustrating a method for fabricating a semiconductor device according to an embodiment of the present disclosure. The method for fabricating the semiconductor device may refer to a photolithography process. Referring to FIG. 8, in step S100, a photoresist film may be formed on the wafer. In step S200, a part of the top surface of the wafer may be exposed by removing a part of the photoresist film using a photomask. The photomask may include a pattern corresponding to a circuit pattern to be formed on the wafer. In step S300, an etching process may be performed using the plasma etching device according to a present disclosure. The details of the plasma etching process will be described later with reference to FIG. 9. After the etching process is completed, the photoresist film remaining on the wafer may be removed in step S400.

Figure 9:
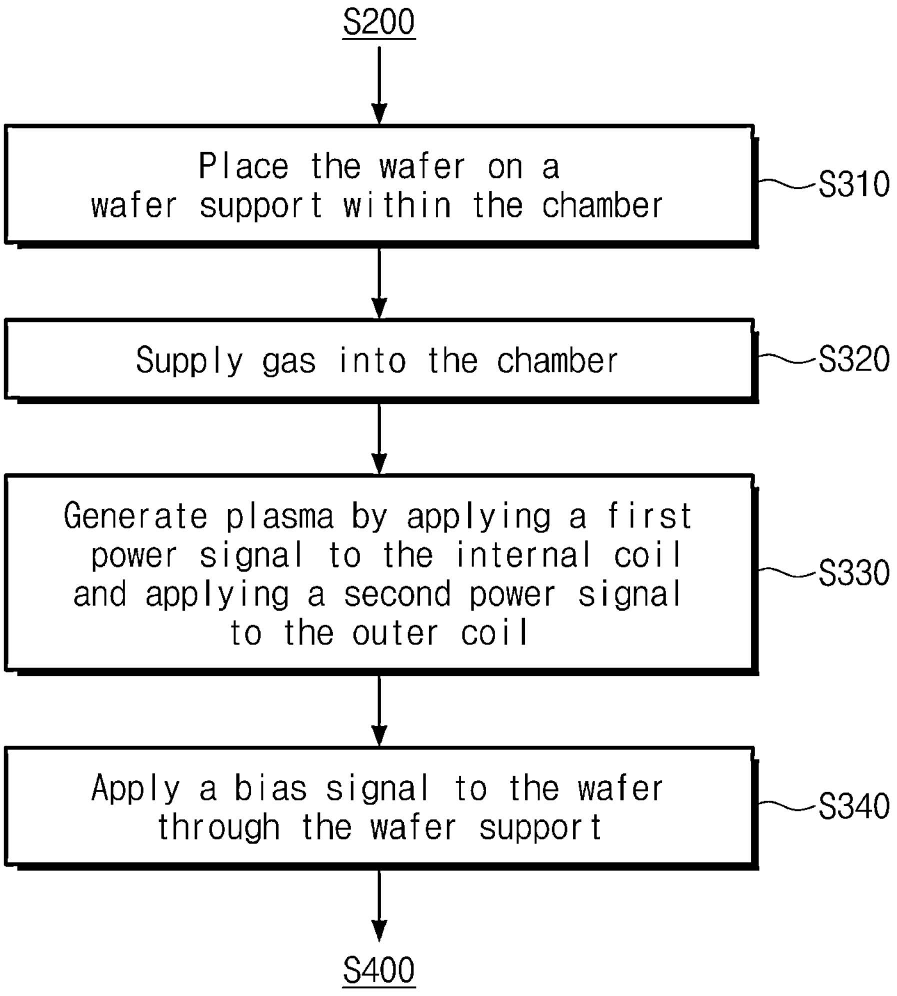
FIG. 9 is a flowchart illustrating an etching process scheme according to an embodiment of the present disclosure.

FIG. 9 is a flowchart illustrating an etching process method according to an embodiment of the present disclosure. FIG. 9 illustrates a detailed method of performing the etching process in step S300 of FIG. 8. Hereinafter, the method for performing the etching process using the plasma etching device of FIG. 1 will be described in detail. Referring to FIGS. 1 and 9, in step S310, the wafer is placed on the wafer support 143 in the chamber 141. The photoresist film patterned through steps S100 and S200 may be provided on the top surface of the wafer. At an initial stage of performing the etching process, the inner part of the chamber 141 may be maintained in a vacuum state, which is referred to as the vacuum chamber 141.

In step S320, the gas supply 142 may supply gas into the chamber 141. In step S330, the plasma may be generated inside the chamber 141 by applying the first power signal RF1 having the first frequency to the inner coil 131 and applying the second power signal RF2 having the second frequency to the outer coil 132. According to an embodiment, the first frequency may be higher than the second frequency. The first frequency may be at least 12 MHz higher than the second frequency. For example, the first frequency may be about 27.12 MHz, and the second frequency may be about 2.0 MHz. According to another embodiment, the first frequency may be fluctuated in the range from 24.3 to 30.7 MHz. For example, the second frequency may be fluctuated in the range of 1.8 to 2.2 MHz.

The plasma etching device may generate the first power signal RF1 using the first power signal output circuit 110-1 and generate the second power signal RF2 using the second power signal output circuit 110-2. The plasma etching device may apply the first power signal RF1 to the inner coil 131 through the first match circuit 121 and apply the second power signal RF2 to the outer coil 132 through the second match circuit 122.

In step S340, the bias RF generator 144 may generate a bias signal. The bias signal may be applied to the wafer through the wafer support 143, and the wafer may also be referred to as the cathode.

As the bias signal is applied to the wafer, the radicals of the plasma generated inside the chamber 141 may be accelerated toward the top surface of the wafer. As the radicals collide with the part (that is an exposed region of the wafer), which has no photoresist film, of the wafer, the etching process may be performed.

In steps S320 to S340, operations of the gas supply 142, the dual RF generator 110, and the bias RF generator 144 may be controlled by the controller 150. For example, the processor of the controller 150 may execute instructions stored in the memory to generate a signal for controlling the gas supply 142, the dual RF generator 110, and the bias RF generator 144 in steps S320 to S340.

As described above, according to an embodiment of the present disclosure, the ICP etching device may be provided to generate plasma having higher electron energy. According to an embodiment of the present disclosure, the method for fabricating the semiconductor device performing the etching process using plasma having higher electron energy may be provided.

The above description refers to detailed embodiments for carrying out the present disclosure. Embodiments in which a design is changed simply or which are easily changed may be included in the present disclosure as well as an embodiment described above. In addition, technologies that are easily changed and implemented by using the above embodiments may be included in the present disclosure. While the present disclosure has been described with reference to exemplary embodiments thereof, it will be apparent to those of ordinary skill in the art that various changes and modifications may be made thereto without departing from the spirit and scope of the present disclosure as set forth in the following claims.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A plasma etching device, comprising:

a dual radio frequency (RF) generator configured to generate a second power signal having a second frequency and a first power signal having a first frequency, which is at least 12 MHz higher than the second frequency;

a match circuit configured to perform impedance matching, based on an impedance of the dual RF generator;

a chamber including a wafer support; and an antenna inductively couplable to an interior of the chamber by an inner coil configured to receive the first power signal and an outer coil configured to receive the second power signal.

2. The plasma etching device of claim 1, wherein the first frequency is in a range from 24.3 MHz to 30.7 MHz, and the second frequency is in a range from 1.8 MHz to 2.2 MHz.

3. The plasma etching device of claim 1, wherein the inner coil is at least partially nested within the outer coil.

4. The plasma etching device of claim 1, wherein the dual RF generator includes a first power signal output circuit configured to generate the first power signal, and a second power signal output circuit configured to generate the second power signal.

5. The plasma etching device of claim 4, wherein the first power signal output circuit includes:

an RF signal generator configured to generate a first RF signal having the first frequency;

an amplifier configured to amplify the first RF signal to generate a first amplified signal; and a low-pass filter configured to cut off a high-band frequency component of the first amplified signal.

6. The plasma etching device of claim 5, wherein the amplifier includes a D-class amplifier.

7. The plasma etching device of claim 4, wherein the match circuit includes:

a first match circuit connected between the first power signal output circuit and the inner coil; and a second match circuit connected between the second power signal output circuit and the outer coil.

8. The plasma etching device of claim 7, wherein each of the first match circuit and the second match circuit includes a fixed-reactance capacitor.

9. The plasma etching device of claim 7, wherein each of the first match circuit and the second match circuit includes a variable-reactance capacitor.

10. The plasma etching device of claim 1, further comprising:

a gas supply configured to supply gas into the chamber; and a bias RF generator configured to transmit a bias signal to the wafer support.

11. The plasma etching device of claim 10, further comprising a controller configured to control the dual RF generator, the match circuit, the gas supply, and the bias RF generator.

12. A plasma etching device, comprising:

a match circuit connected with one end of an inner coil of which opposite end is connected to a ground node, connected with one end of an outer coil of which opposite end is connected to the ground node, and configured to perform impedance matching;

a wafer support configured to position a wafer thereon; and a chamber including the wafer and the wafer support, and configured to be supplied gas therein;

wherein the match circuit transmits a first power signal to the inner coil, and transmits a second power signal to the outer coil to form a plasma in the chamber, wherein the wafer support receives a bias signal to thereby enable the wafer to be etched, and wherein a first frequency of the first power signal is at least 12 MHz higher than a second frequency of the second power signal.

13. The plasma etching device of claim 12, wherein the first frequency is in a range from 24.3 MHz to 30.7 MHz, and the second frequency is in a range from 1.8 MHz to 2.2 MHz.

14. The plasma etching device of claim 12, wherein the inner coil extends at least partially within the outer coil.

15. The plasma etching device of claim 12, further comprising:

a first power signal output circuit configured to generate the first power signal; and a second power signal output circuit configured to generate the second power signal.

16. The plasma etching device of claim 15, wherein the match circuit includes:

a first match circuit connected between the first power signal output circuit and the inner coil; and a second match circuit connected between the second power signal output circuit and the outer coil; and wherein the first power signal is applied to the inner coil through the first match circuit, and the second power signal is applied to the outer coil through the second match circuit.

17. A plasma etching device, comprising:

a photoresist film formed on a wafer, wherein at least a portion of a top surface of the wafer is exposed;

a match circuit connected with one end of an inner coil of which opposite end is connected to a ground node, connected with one end of an outer coil of which opposite end is connected to the ground node, and configured to thereby enable the wafer to be etched;

wherein the match circuit transmits a first power signal to the inner coil, and transmits a second power signal to the outer coil to form a plasma, and wherein a first frequency of the first power signal is at least 12 MHz higher than a second frequency of the second power signal.

18. The plasma etching device of claim 17, wherein the first frequency is in a range from 24.3 MHz to 30.7 MHz, and the second frequency is in a range from 1.8 MHz to 2.2 MHz.

19. The plasma etching device of claim 17, further comprising:

a first power signal output circuit configured to generate the first power signal; and a second power signal output circuit configured to generate the second power signal.

20. The plasma etching device of claim 19, wherein the match circuit includes:

a first match circuit connected between the first power signal output circuit and the inner coil; and a second match circuit connected between the second power signal output circuit and the outer coil;

wherein the first power signal is applied to the inner coil through the first match circuit, and the second power signal is applied to the outer coil through the second match circuit.

* * * * *